US012750990B2

(12) United States Patent
Hamano et al.

(10) Patent No.: US 12,750,990 B2
(45) Date of Patent: Sep. 29, 2026

(54) ELECTRONIC DEVICE AND REFRIGERANT CIRCULATION DEVICE

(71) Applicant: Nidec Corporation, Kyoto (JP)

(72) Inventors: Shinsuke Hamano, Kyoto (JP); Tomoaki Ando, Kyoto (JP); Taku Murakami, Kyoto (JP); Hirotaka Watanabe, Kyoto (JP); Naoya Nonomura, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 267 days.

(21) Appl. No.: 18/619,760

(22) Filed: Mar. 28, 2024

(65) Prior Publication Data

US 2024/0334664 A1 Oct. 3, 2024

(30) Foreign Application Priority Data

Mar. 30, 2023 (JP) ................................ 2023-055584

(51) Int. Cl.
*H05K 7/20* (2006.01)

(52) U.S. Cl.
CPC ..... *H05K 7/20981* (2013.01); *H05K 7/20272* (2013.01)

(58) Field of Classification Search
CPC ........... H05K 7/20981; H05K 7/20272; H05K 7/1427; H05K 5/0018; H05K 9/0096; H05K 7/20781; H05K 7/20; H05K 7/20954; H05K 9/0015; H05K 9/0037; H05K 7/20772; H05K 7/20709; G06F 1/20; G06F 1/1601; G06F 2200/1612; G06F 2200/201; G02F 1/133308; G02F 1/133385; Y10T 29/49002; Y10T 29/4913; F24F 11/30; F25D 2323/021; F25D 23/02; F25D 11/02
See application file for complete search history.

(56) References Cited

U.S. PATENT DOCUMENTS

| | | | | |
|---|---|---|---|---|
| 9,709,295 | B2 * | 7/2017 | Adamik ................. | G05D 23/32 |
| 2004/0196628 | A1 * | 10/2004 | Hisano ............... | H05K 7/20972 361/689 |
| 2006/0087804 | A1 * | 4/2006 | Tsukamoto ....... | G02F 1/133308 361/679.22 |
| 2006/0104023 | A1 * | 5/2006 | Lee .................... | H05K 7/20972 361/679.48 |
| 2007/0127215 | A1 * | 6/2007 | Jeong ................. | H05K 7/20963 313/46 |

(Continued)

FOREIGN PATENT DOCUMENTS

| | | | |
|---|---|---|---|
| CN | 205784213 | U | 12/2016 |
| CN | 107211559 | A | 9/2017 |

OTHER PUBLICATIONS

Wu et al. Display control component for cold storage and freezing device and cold storage and freezing device, Dec. 7, 2016. CN205784213 (Year: 2016).*

(Continued)

*Primary Examiner* — Michael A Matey
(74) *Attorney, Agent, or Firm* — Keating & Bennett, LLP

(57) ABSTRACT

An electronic device includes a conductive panel including a first opening, a display to display an image, and an electrically insulating spacer fixed to the panel. The spacer supports the display at a position away from the first opening in an intersecting direction intersecting with the first opening, and electrically isolates the display from the panel.

11 Claims, 7 Drawing Sheets

(56) References Cited

U.S. PATENT DOCUMENTS

| | | | | |
|---|---|---|---|---|
| 2011/0090624 | A1* | 4/2011 | Kim | H05K 7/20963 361/679.01 |
| 2012/0031111 | A1* | 2/2012 | Kulkarni | F25D 25/00 62/340 |
| 2012/0104024 | A1* | 5/2012 | Anselmino | B67D 1/0857 62/390 |
| 2014/0150467 | A1* | 6/2014 | Boarman | F25C 1/24 62/3.63 |
| 2016/0255749 | A1* | 9/2016 | Isaji | H05K 9/0054 361/752 |
| 2018/0027698 | A1 | 1/2018 | Cader et al. | |

OTHER PUBLICATIONS

Wang et al. Refrigerating-Freezing device for door of refrigerating-freezing device , May 26, 2020, CN210625095 (Year: 2020).*

Official Communication issued in corresponding Chinese Patent Application No. 113111885, mailed on Feb. 6, 2025, 8 pages.

* cited by examiner

ELECTRONIC DEVICE AND REFRIGERANT CIRCULATION DEVICE

CROSS-REFERENCE TO RELATED APPLICATIONS

The present application claims priority under 35 U.S.C. § 119 to Japanese Patent Application No. 2023-055584, filed on Mar. 30, 2023, the entire contents of which are hereby incorporated herein by reference.

1. FIELD OF THE INVENTION

The present disclosure relates to an electronic device and a refrigerant circulation device.

2. BACKGROUND

An electronic device of the related art includes a metallic upper cover, and a case body including a lower cover and a frame body. A liquid crystal cell and a circuit board are housed in the case body. The liquid crystal cell is bonded to the frame body with a double-sided tape.

However, the related art insufficient in is electrostatic countermeasure. Specifically, since the metallic upper cover and the liquid crystal cell are in direct contact with each other, there is a possibility that burnout or malfunction of the liquid crystal cell is caused by discharge caused by static electricity or the like.

SUMMARY

An example embodiment of an electronic device according to the present disclosure includes a conductive panel including a first opening, a display to display an image, and an electrically insulating spacer fixed to the panel. The spacer supports the display at a position away from the first opening in an intersecting direction intersecting with the first opening, and electrically isolates the display from the panel.

An example embodiment of a refrigerant circulation device according to the present disclosure includes the electronic device and a pump assembly. The chassis further includes a flow path for a refrigerant. The pump assembly pressure-feeds the refrigerant in the flow path.

The above and other elements, features, steps, characteristics and advantages of the present disclosure will become more apparent from the following detailed description of the example embodiments with reference to the attached drawings.

DETAILED DESCRIPTION

Figure 1:
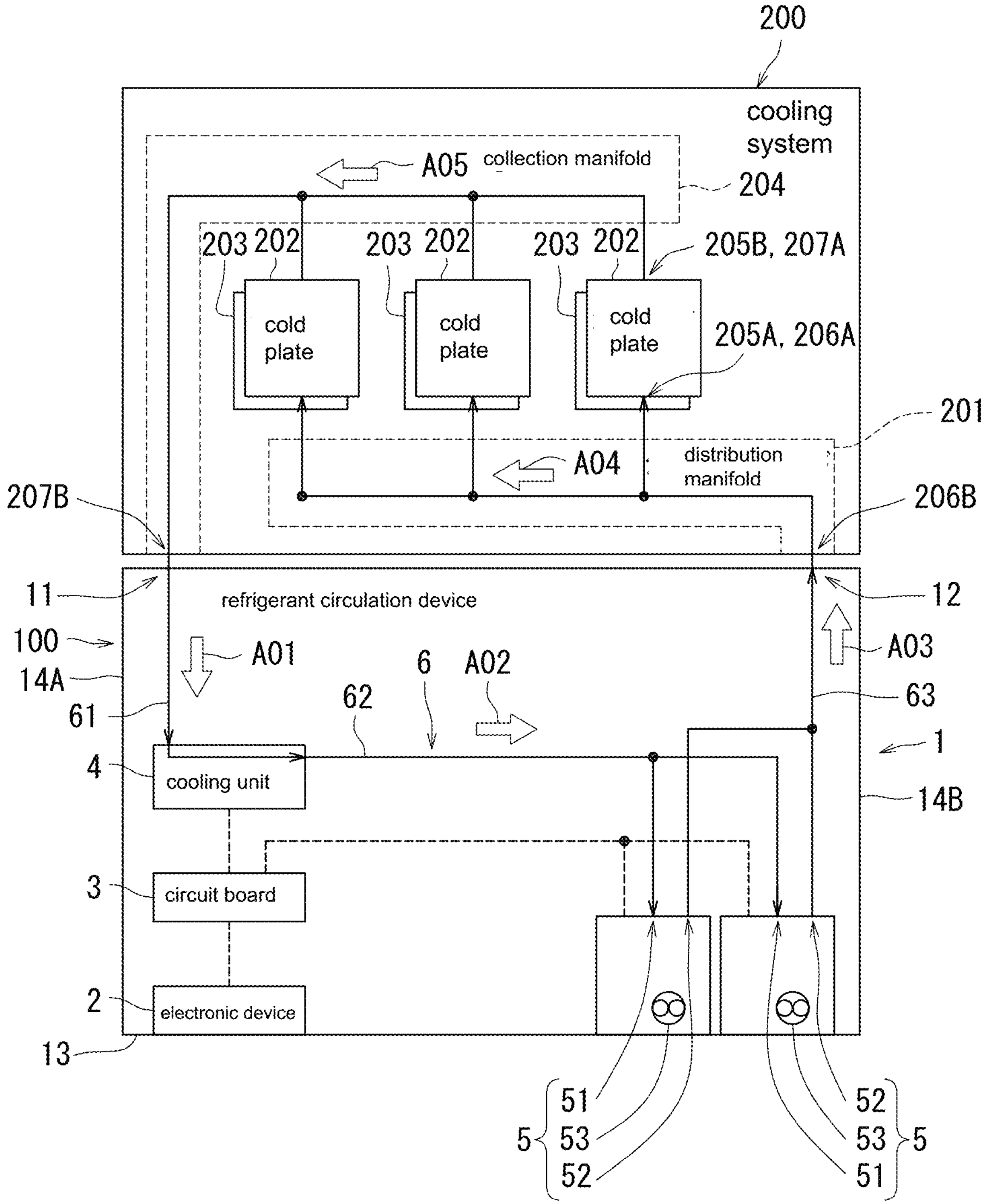
FIG. 1 is a block diagram illustrating a configuration of a cooling system according to an example embodiment of the present disclosure.

Hereinafter, refrigerant circulation devices (hereinafter, described as "CDU") according to example embodiments of the present disclosure will be described with reference to the drawings. In the drawings, the same or corresponding parts are denoted by the same reference signs and description thereof will not be repeated.

FIG. 1 is a block diagram illustrating a configuration of a CDU 100. As illustrated in FIG. 1, the CDU 100 is used with a cooling device 200, but is distributed on the market independently.

The cooling device 200 includes a distribution manifold 201, a plurality of cold plates 202, a plurality of heat sources 203, and a collection manifold 204. The cooling device 200 may not include the distribution manifold 201 and the collection manifold 204. The numbers of cold plates 202 and heat sources 203 may be at least one.

The refrigerant circulates between the CDU 100, the distribution manifold 201, the plurality of cold plates 202, and the collection manifold 204 as indicated by the plurality of arrows A01 to A05. The refrigerant is, for example, a coolant. Examples of the coolant include antifreeze liquid and pure water. A typical example of antifreeze liquid is an ethylene glycol aqueous solution or a propylene glycol aqueous solution.

High-temperature refrigerant flows into the CDU 100 from the collection manifold 204 (see arrow A01). The CDU 100 cools and pressure-feeds the refrigerant. When the refrigerant is pressure-fed, the refrigerant circulates between the cooling device 200 and the CDU 100 (see arrows A01 to A05). Specifically, the low-temperature refrigerant flows into the plurality of cold plates 202 via the distribution manifold 201 (see arrow A04) and flows through the plurality of cold plates 202. The plurality of cold plates 202 come into thermal contact with the plurality of heat sources 203. Each heat source 203 is typically a device that generates heat, and is a component of a computer device in the example embodiment. The computer device is typically a rack mounted server. The computer device may be a blade server. Other examples of the heat source 203 include an electrolytic capacitor, a power semiconductor module, and a printed circuit board.

Each of the cold plates 202 has an inflow port 205A and an outflow port 205B. In FIG. 1, for convenience, reference numerals "205A" and "205B" are representatively given only to one cold plate 202. The refrigerant flows into each of the inflow ports 205A from the downstream end 206A of the distribution manifold 201 (see arrow A04). The refrigerant flows from the inflow port 205A toward the outflow port 205B in each cold plate 202. Accordingly, the heat generated by the heat source 203 moves to the refrigerant flowing in each cold plate 202. As a result, the temperature of the refrigerant becomes high. The high-temperature refrigerant flows out from each outflow port 205B to each upstream end 207A of the collection manifold 204 and flows in the collection manifold 204 (see arrow A05).

The CDU 100 generally includes a chassis 1, an electronic device 2, a circuit board 3, a cooling unit 4, at least one pump assembly 5, and a flow path 6. In the example embodiment, two pump assemblies 5 are exemplified.

The chassis 1 has an inflow port 11 and an outflow port 12 for the refrigerant. The inflow port 11 is connected with a downstream end 207B of the collection manifold 204. The refrigerant flows into the inflow port 11 from the downstream end 207B. The outflow port 12 is connected with an upstream end 206B of the distribution manifold 201. The refrigerant flows out from the outflow port 12 to the upstream end 206B.

The chassis 1 accommodates the circuit board 3, the cooling unit 4, the pump assembly 5, and the flow path 6. That is, the chassis 1 has the flow path 6 for the refrigerant.

The circuit board 3 includes a power supply circuit and a control circuit. The power supply circuit generates a high voltage and a low voltage from, for example, an AC voltage supplied from a commercial power supply. The high voltage is, for example, 54 V, and is supplied to the cooling unit 4 and the pump assembly 5 in order to drive the cooling unit 4 and the pump assembly 5. The low voltage is, for example, 3.3 V. The control unit includes a microcomputer, a memory, and the like, and operates with a low voltage. The microcomputer controls the operation of the CDU 100 according to a program stored in the memory.

The cooling unit 4 cools the refrigerant flowing through the flow path 6. The type of the cooling unit 4 is not particularly limited. As the cooling unit 4, an air cooling system or a water cooling system can be adopted. In the case of the air cooling system, the cooling unit 4 includes a radiator and a fan. The radiator is connected to the downstream end of a pipe 61. High-temperature refrigerant flows into the radiator from the downstream end of the pipe 61. The radiator is connected to the upstream end of a pipe 62. The radiator guides the refrigerant flowing in from its own inflow port to its own outflow port. In the process, the refrigerant flowing in the radiator is cooled by the airflow generated by the fan. As a result, low-temperature refrigerant flows out from the outflow port of the radiator.

The pump assembly 5 pressure-feeds the refrigerant in the flow path 6. Specifically, the pump assembly 5 includes a suction port 51, a discharge port 52, and a pump rotor 53. The suction port 51 is connected to the downstream end of the pipe 62. The discharge port 52 is connected to the upstream end of a pipe 63. When the pump rotor 53 rotates, pressure is applied to the refrigerant in the pump assembly 5. As a result, the refrigerant in the pipe 62 is sucked from the suction port 51. The sucked refrigerant is discharged from the discharge port 52 to the pipe 63.

The type of the pump assembly 5 is not particularly limited. That is, as the pump assembly 5, for example, a centrifugal pump, a propeller pump, a viscous pump, or a rotary pump can be adopted. When the pump rotor 53 is a centrifugal pump, a propeller pump, a viscous pump, or a gear pump, the pump rotor is a vane wheel (impeller). When the pump rotor 53 is a screw pump, the pump rotor is a screw.

The pump assembly 5 may be insertable into and removable from the chassis 1, or may be installed in the chassis 1.

The flow path 6 includes the pipes 61 to 63. By the pipes 61 to 63, the cooling unit 4 and each pump assembly 5 are connected between the inflow port 11 and the outflow port 12 so that the refrigerant flows. Specifically, the upstream end of the pipe 61 is connected to the inflow port 11. The downstream end of the pipe 61 is connected to the inflow port of the cooling unit 4. The upstream end of the pipe 62 is connected to the outflow port of the cooling unit 4. The downstream end of the pipe 62 is connected to each suction port 51. The upstream end of the pipe 63 is connected to each discharge port 52. The downstream end of the pipe 63 is connected to the outflow port 12. As a result, in the chassis 1 (that is, the CDU 100), the refrigerant can flow from the inflow port 11 to the outflow port 12 via the cooling unit 4 and the respective pump assemblies 5 sequentially (see arrows A01 to A03).

Figure 2:
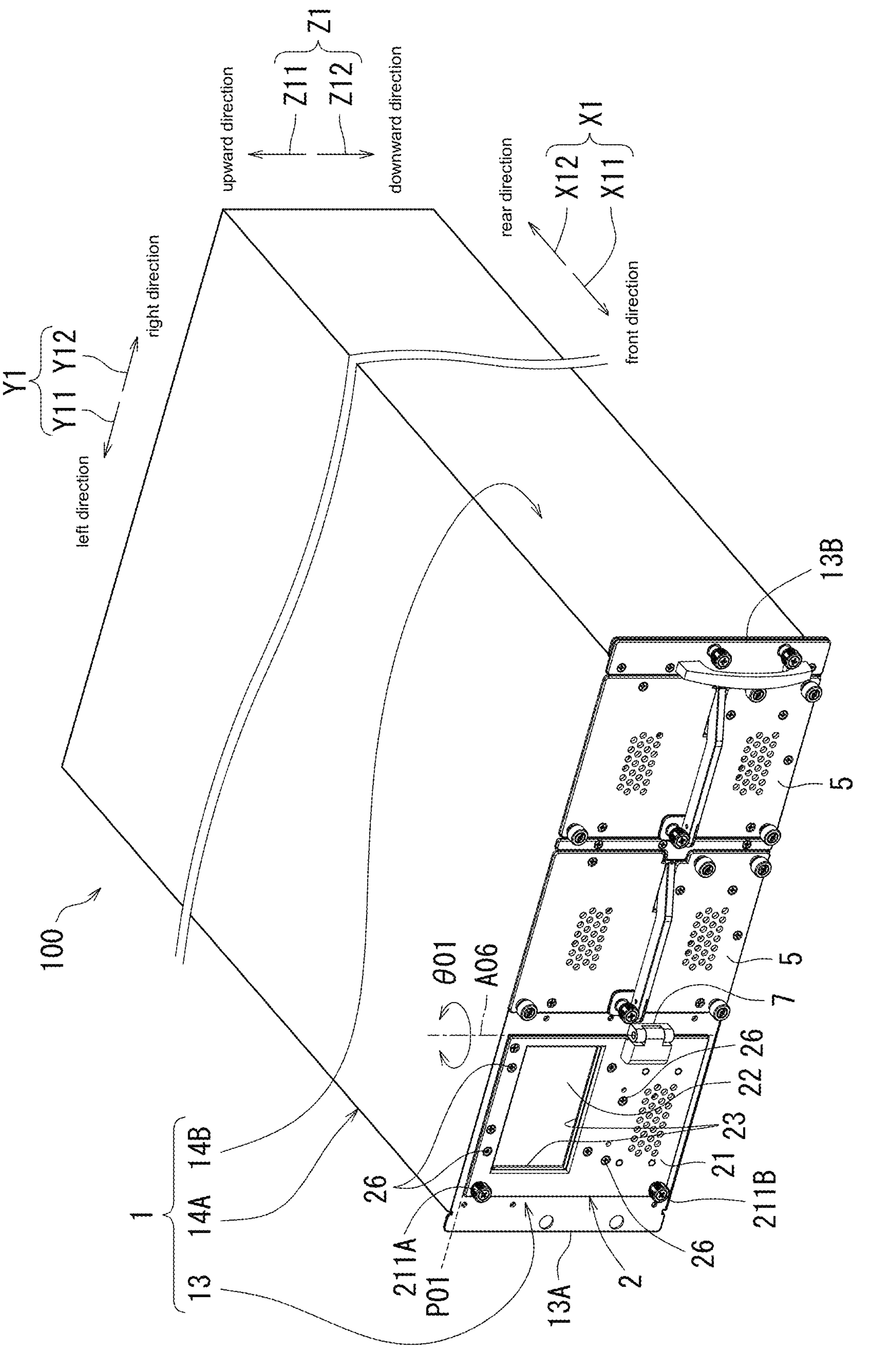
FIG. 2 is a perspective view illustrating a refrigerant circulation device in a closed state according to an example embodiment of the present disclosure.
Figure 3:
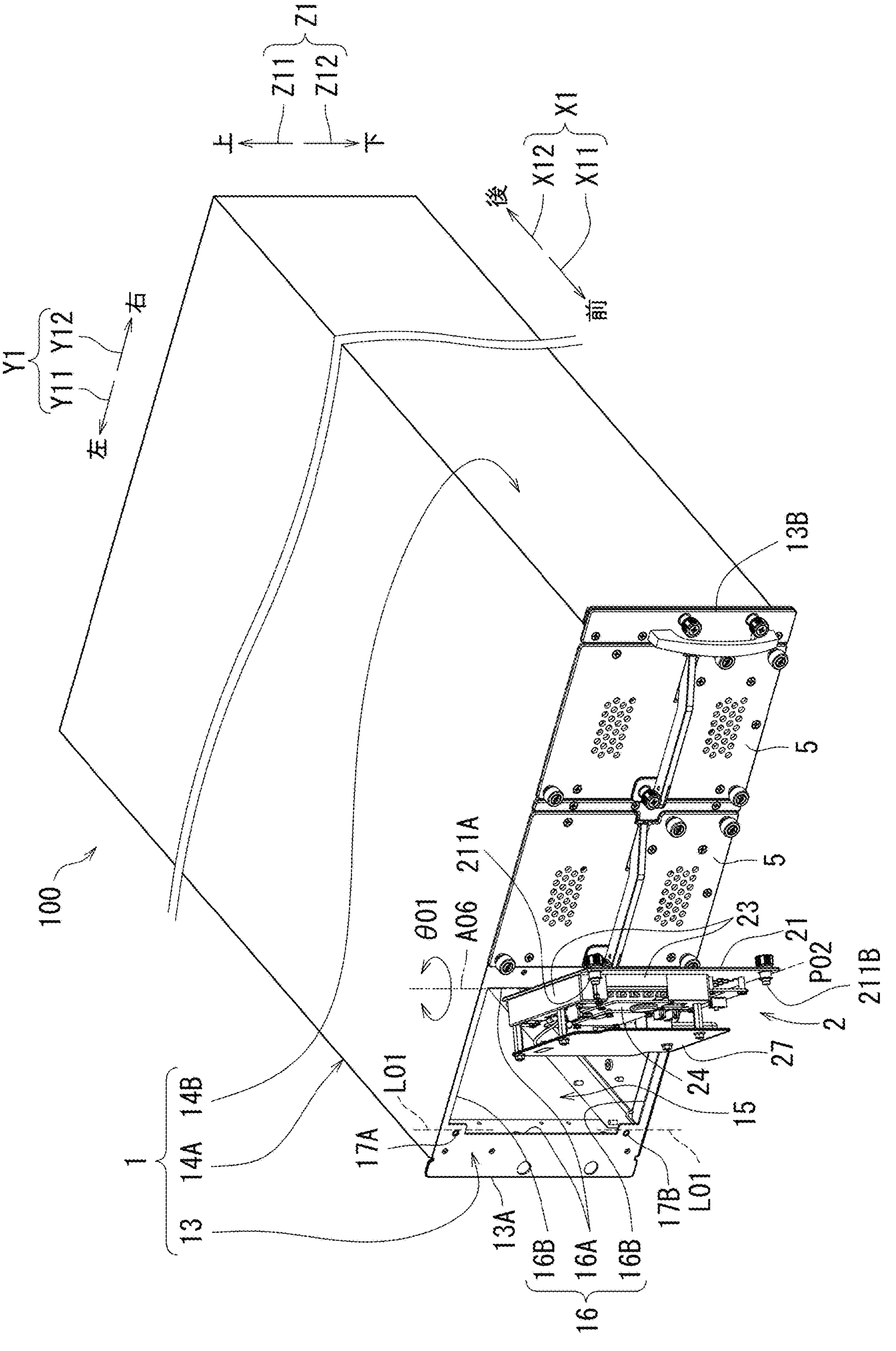
FIG. 3 is a perspective view illustrating the refrigerant circulation device in an open state.

FIGS. 2 and 3 are perspective views illustrating main parts of the CDU 100 in a closed state and an open state, respectively.

FIGS. 2 and 3 illustrate the front-back direction X1, the up-down direction Z1, and the left-right direction Y1 of the CDU 100.

In the example embodiment, the front-back direction X1 is a direction intersecting with an opening 15. In the example embodiment, the term "intersect" includes not only that lines, planes, or lines and planes intersect with each other at a right angle but also that lines and planes intersect with each other at a non-right angle within a range of a slight difference (tolerance, error, or the like). The front-back direction X1 includes a front direction X11 and a rear direction X12 opposite to the front direction X11. The front direction X11 is a direction in which the opening 15 is opened.

The up-down direction Z1 is substantially parallel to the vertical direction in a state where the CDU 100 can be used. The up-down direction Z1 includes an upward direction Z11 and a downward direction Z12. The upward direction Z11 is vertically upward, and the downward direction Z12 is vertically downward.

The left-right direction Y1 intersects with each of the front-back direction X1 and the up-down direction Z1, and includes a left direction Y11 and a right direction Y12 opposite to the left direction Y11. The left direction Y11 is a direction of the left hand toward the opening 15.

As illustrated in FIGS. 2 and 3, the chassis 1 is a substantially rectangular parallelepiped and has outer walls 13, 14A, and 14B. The outer wall 13 is a front wall. The outer walls 14A and 14B are a left side wall and a right side wall. The outer wall 13 has a substantially rectangular shape in the first plan view, and extends in each of the up-down direction Z1 and the left-right direction Y1. The "first plan view" is a plan view from the front-back direction X1. The outer walls 14A and 14B extend in the rear direction X12 from a left end 13A and a right end 13B of the outer wall 13. The outer walls 14A and 14B extend in the front-back direction X1 and the up-down direction Z1, respectively.

The chassis 1 further includes the opening 15 (see FIG. 3). The opening 15 is an example of the "second opening" in the present disclosure. Specifically, as illustrated in FIG. 3, the opening 15 is formed at a position closer to the left end 13A of the left end 13A and the right end 13B in the outer wall 13. The outer wall 13 has an inner edge 16 facing the opening 15. The opening 15 and the inner edge 16 have a substantially rectangular shape in the first plan view. The inner edge 16 has opposite sides 16A and 16B. The opposite sides 16A are a pair of sides extending along the up-down direction Z1 and separated in the left-right direction Y1. The opposite sides 16B are a pair of sides extending along the left-right direction Y1 and separated in the up-down direction Z1. The opposite sides 16A and 16B are substantially orthogonal to each other when extended. In the example embodiment, screw holes 17A and 17B are formed in the outer wall 13 near the upper left corner and the lower left corner of the inner edge 16, respectively. The screw holes 17A and 17B are formed on the same imaginary line L01. The imaginary line L01 extends substantially parallel to the up-down direction Z1 along the outer wall 13.

Figure 4:
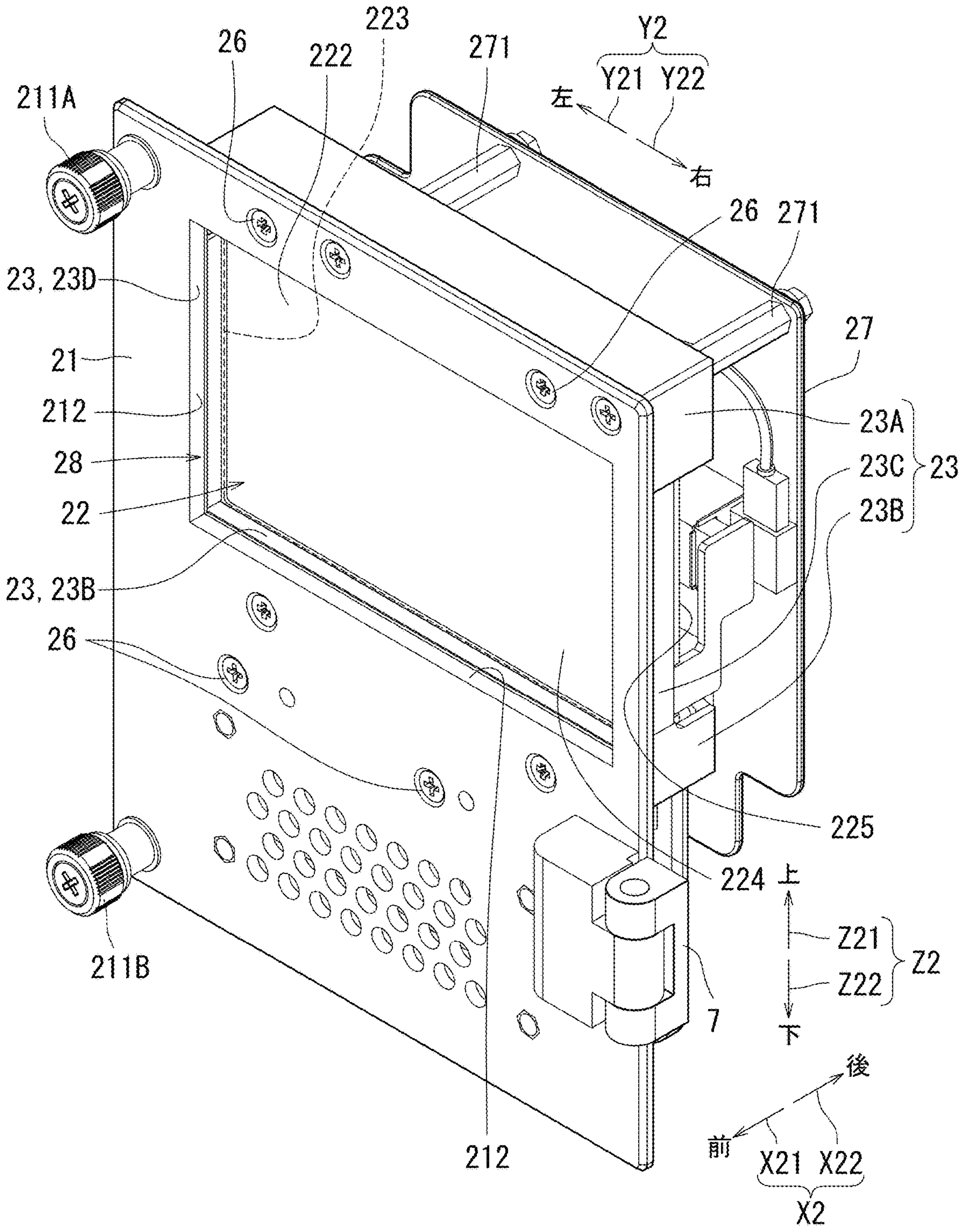
FIG. 4 is a perspective view of the electronic device as viewed from obliquely above on a front side.
Figure 5:
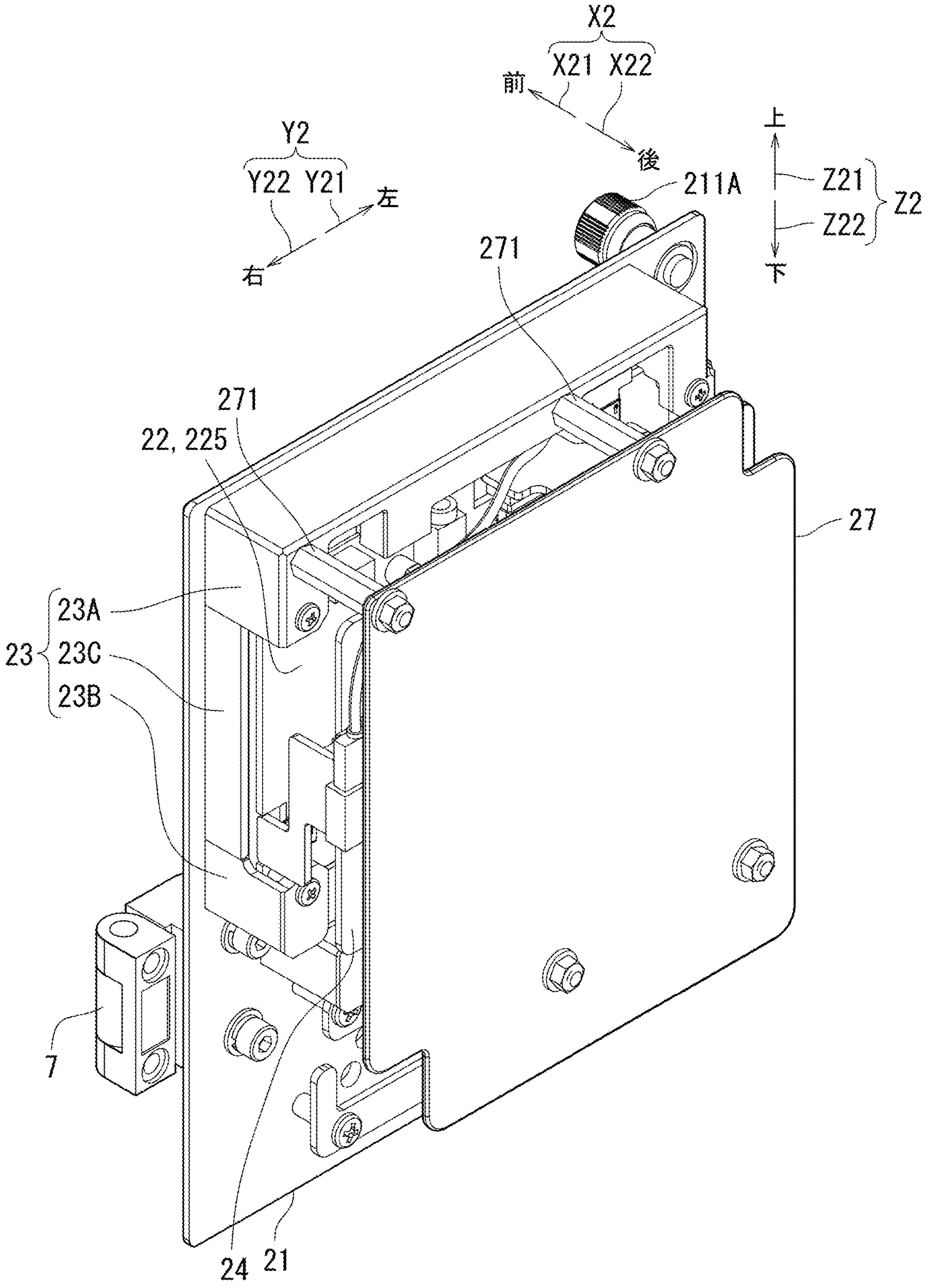
FIG. 5 is a perspective view of the electronic device as viewed from obliquely above on a back side.
Figure 6:
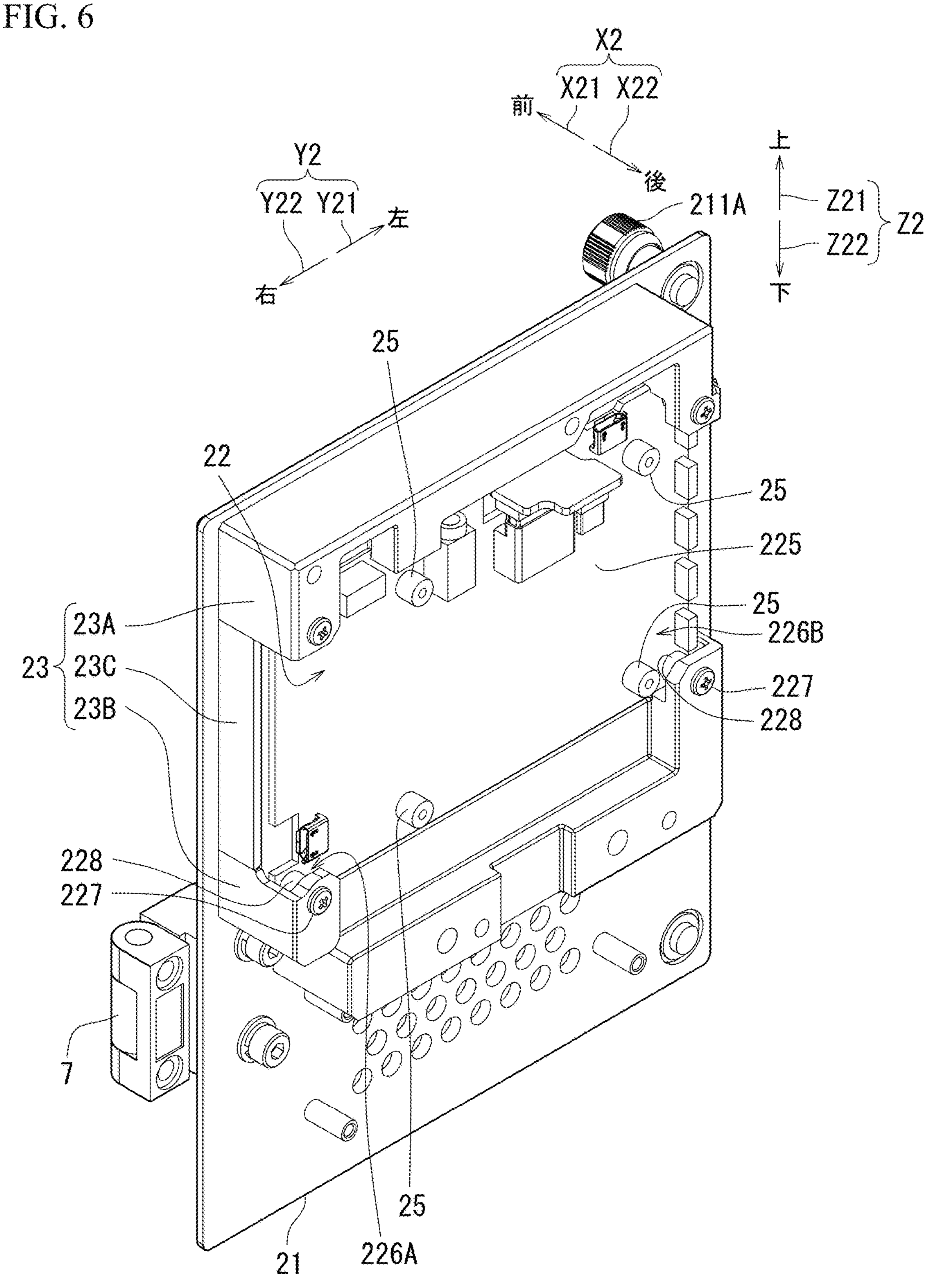
FIG. 6 is a perspective view of a display and a spacer of the electronic device as viewed from obliquely above on a back side.
Figure 7:
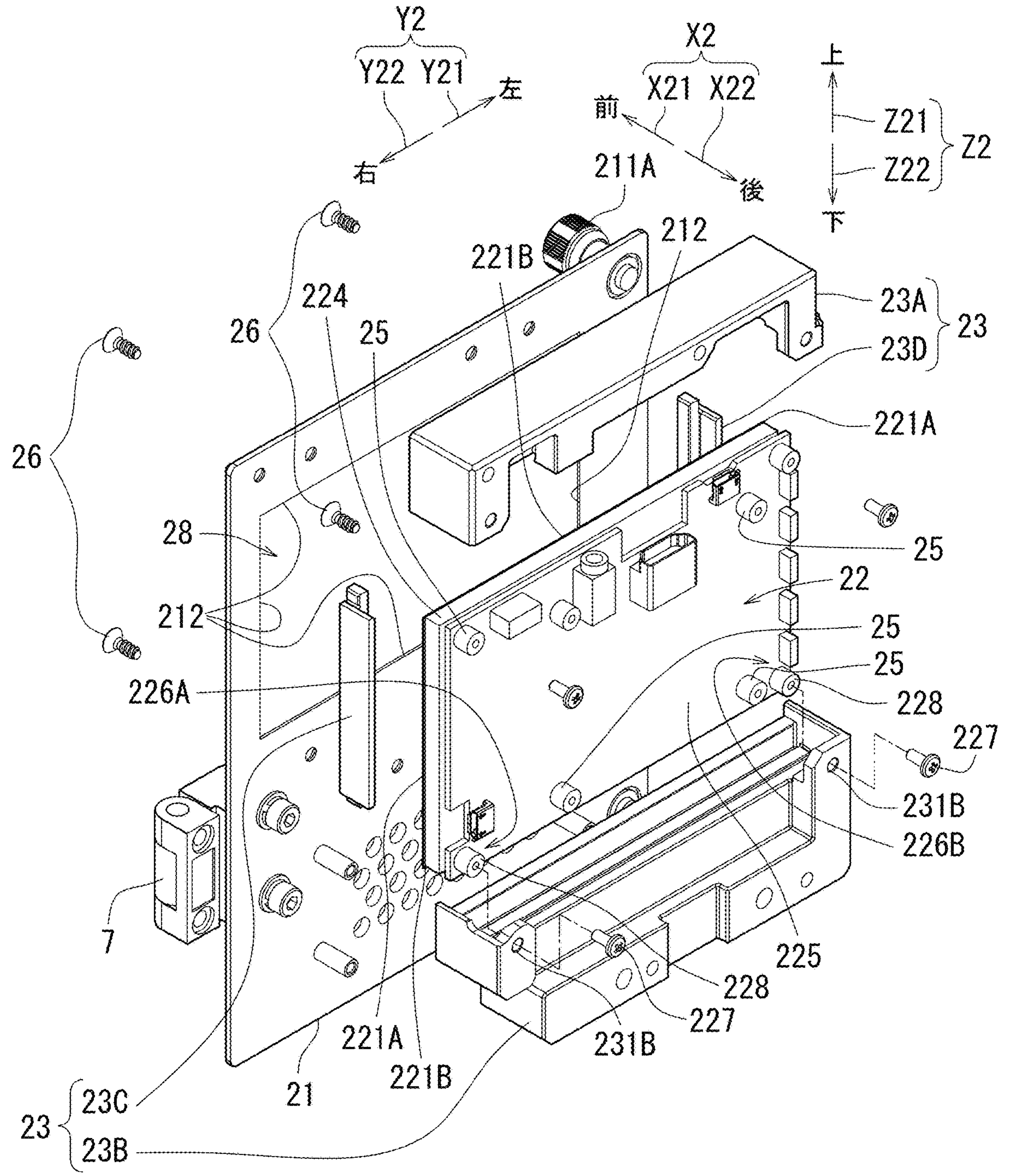
FIG. 7 is an exploded view of the electronic device.

FIG. 4 is a perspective view of the electronic device 2 as viewed from obliquely above on a front side. FIG. 5 is a perspective view of the electronic device 2 as viewed from obliquely above on a back side. FIG. 6 is a perspective view of a display 22 and a spacer 23 of the electronic device 2 as viewed from obliquely above on a back side. FIG. 7 is an exploded view of the electronic device 2.

FIGS. 4 to 7 illustrate a front-back direction X2, an up-down direction Z2, and a left-right direction Y2 of the electronic device 2.

In the example embodiment, the front-back direction X2 is a direction intersecting with an opening 28. The front-back direction X2 includes a front direction X21 and a rear direction X22 opposite to the front direction X21. The front direction X21 is a direction in which the opening 28 is opened. The front-back direction X2 is substantially parallel to the front-back direction X1 when the CDU 100 is in the closed state (see FIG. 2). The opening 28 and the front-back direction X2 are examples of a "first opening" and an "intersecting direction" in the present disclosure.

The up-down direction Z2 is substantially the same as the up-down direction Z1, and includes an upward direction Z21 vertically upward and a downward direction Z22 vertically downward.

The left-right direction Y2 intersects with each of the front-back direction X2 and the up-down direction Z2, and includes a left direction Y21 and a right direction Y22 opposite to the left direction Y21. The left direction Y21 is a direction of the left hand toward the opening 28.

As illustrated in FIGS. 4 to 7, the electronic device 2 includes a panel 21, a display 22, a spacer 23, a circuit board 24 (see FIG. 5), a board support portion 25 (see FIGS. 6 and 7), a plurality of fixing portions 26 (see FIGS. 4 and 7), and a cover 27 (see FIGS. 4 and 5). The fixing portion 26 is an example of a "fixing portion" in the present disclosure.

The panel 21 is electrically conductive and has an opening 28. Specifically, metal is exemplified as the conductive material. In the example embodiment, each dimension of the panel 21 in the up-down direction Z2 and the left-right direction Y1 is slightly larger than each dimension of the opening 15 in the up-down direction Z1 and the left-right direction Y1. Therefore, the area of the panel 21 is slightly larger than the area of the opening 15. Thumbscrews 211A and 211B are attached near the upper left corner and the lower left corner of the panel 21, respectively. The display 22 displays an image. The image includes at least one of a character, a picture, a figure, and a photograph. The display 22 is a flat panel display such as a liquid crystal display or an organic EL display. As illustrated in FIG. 7, the display 22 is a thin substantially rectangular parallelepiped in the front-back direction X2, and includes a display panel 224 and a control unit 225 (see FIG. 7). The control unit 225 is located in the rear direction X22 of the display panel 224, and controls display of an image on the display panel 224. The spacer 23 is electrically insulating and fixed to the panel 21 (see FIGS. 4 and 7). The spacer 23 further supports the display 22 away from the opening 28 in the rear direction X22 (see FIG. 4) to electrically isolate it from the panel 21. Therefore, the influence of static electricity on the display 22 is suppressed.

The spacer 23 is preferably made of a hard resin and is in direct contact with each of the panel 21 and the display 22 (see FIG. 4). That is, the spacer 23 is interposed between the panel 21 and the display 22. Since the spacer 23 is hard and is hardly elastically deformed, the insulation distance between the panel 21 and the display 22 is stabilized. Examples of the hard resin include polypropylene, polycarbonate, methacrylic resin, and polyimide.

The circuit board 24 includes at least a printed circuit board and electronic components. On the printed circuit board, wiring formed of a conductive material is formed on or in a board made of an insulating material. The electronic component includes at least one selected from an active element, a passive element, and an integrated circuit, and is mounted on or in a printed circuit board. In the example embodiment, the circuit board 24 has a display control circuit and/or a drive circuit for the display 22 on a printed circuit board.

The board support portion 25 supports the circuit board 24 at a position farther from the opening 28 in the rear direction X22 than the display 22 (see FIG. 5). In FIGS. 4 and 5, the board support portion 25 is hidden. The board support portion 25 is provided on the back surface of the control unit 225 included in the display 22 (see FIGS. 6 and 7). The back surface is a surface on the rear direction X22 side in the control unit 225. The board support portion 25 is made of resin having electrical insulation properties. Therefore, the circuit board 24 is electrically isolated from the panel 21 and thus protected from static electricity. Specifically, the board support portion 25 includes four bosses in the example embodiment. Each boss is also called a screw spacer, and may be integrally provided on the back surface of the control unit 225. Each boss protrudes from the display 22 in the rear direction X22. A screw hole extending in the front direction X21 is formed at the tip of each boss. The circuit board 24 is fastened to the tips of the bosses with screws (not illustrated).

The display 22 has a polygonal shape in the second plan view. The "second plan view" is a plan view from the front-back direction X2. Specifically, the polygon is typically a rectangle, but may be a pentagon or more. The display 22 has opposite sides 221A and 221B (see FIG. 7). The opposite sides 221A are a pair of sides extending along the up-down direction Z2 and separated in the left-right direction Y2. The opposite sides 221B are a pair of sides extending along the left-right direction Y2 and separated in the up-down direction Z2. The opposite sides 221A and 221B are substantially orthogonal to each other when extended.

For example, the spacer 23 is in contact with one and the other of the opposite sides 221A to support the display 22 (see FIGS. 4 and 7). In addition, the spacer 23 may be in contact with each of one and the other of the opposite sides 221B to support the display 22. The display 22 is stably supported by being in contact with one and the other of the opposite sides 221A as compared with a case where one of the opposite sides 221A and one of the opposite sides 221B are in contact with each other.

In the display 22, the display panel 224 has a region (hereinafter, referred to as a "display region") 222 in which an image is displayed (see FIG. 4). That is, the display 22 has the display region 222. The display region 222 has a substantially rectangular shape in the second plan view, and is a region in which an image is displayed on the display 22. An outer periphery 223 of the display region 222 is indicated by a broken line in FIG. 4. The panel 21 has an inner edge 212 having a substantially rectangular shape in the second plan view (see FIGS. 4 and 7). The inner edge 212 faces the opening 28 (see FIGS. 4 and 7). As illustrated in FIG. 4, the display region 222 is located in the opening 28 such that the outer periphery 223 coincides with and overlaps the inner edge 212 in the second plan view. The spacer 23 is interposed between the entire region of the inner edge 212 and the entire region of the outer periphery 223. Therefore, the spacer 23 prevents entry of foreign matter from the outside to the inside of the chassis 1.

The spacer 23 is preferably composed of divided spacers 23A to 23D (see FIG. 7). The divided spacers 23A to 23D have a shape obtained by dividing the spacer 23 of the frame body into four. Therefore, ease of manufacturing and assembling of the electronic device 2 is improved. The four divided spacers 23A to 23D are interposed between the entire region of the inner edge 212 and the entire region of the outer periphery 223.

In the example embodiment, as illustrated in FIGS. 6 and 7, the divided spacer 23B sandwiches the lower right corner portion 226A and the lower left corner portion 226B of the display 22 in the front-back direction X2. The lower left corner is an end in each of the downward direction Z22 and the left direction Y21. The lower right corner is an end in each of the downward direction Z22 and the right direction Y22.

The electronic device 2 further includes a plurality of fixing portions 227. The plurality of fixing portions 227 fix the divided spacer 23B to the display 22. In the example embodiment, each fixing portion 227 is a screw. In this case, a through hole 231B is formed at each of the right end and the left end of the divided spacer 23B. A boss (screw spacer) 228 is also formed on the back surface of the control unit 225 at substantially the same position as the through hole 231B in the display 22. The divided spacer 23B is fixed to the display 22 by a screw as the fixing portion 227 in a state where the through hole 231B and the screw hole of the boss are aligned.

The divided spacer 23A sandwiches the upper right corner portion 226C and the upper left corner portion 226D of the display 22 in the front-back direction X2 in the same manner as the divided spacer 23B.

The divided spacers 23A and 23B may sandwich portions other than corners of the display 22 in the front-back direction X2.

The display 22 is stably supported in the electronic device 2 by the divided spacers 23A and 23B and the fixing portion 227.

The plurality of fixing portions 26 fix the spacer 23 to the panel 21. In the example embodiment, each fixing portion 26 is a screw. In this case, a through hole is formed in the panel 21. A screw hole is formed at substantially the same position as the through hole of the panel 21 on the front surface of the spacer 23. In a state where the through hole and the screw hole are aligned, the spacer 23 is fixed to the panel 21 by a screw as the fixing portion 26.

The fixing portion 26 is conductive. In this case, it is preferable that the spacer 23 does not penetrate from one side (that is, the front surface) to the other side (that is, the rear surface) in the front-back direction X2. As a result, insulation between the conductive fixing portion 26 and the display 22 is secured. That is, the influence of static electricity on the display 22 is suppressed.

The fixing portion 26 may be electrically insulating. The electrically insulating fixing portion 26 may or may not penetrate the spacer 23 in the front-back direction X2. Also in this case, the influence of static electricity on the display 22 is suppressed. In a case where the fixing portion 26 is a screw and the screw does not penetrate the spacer 23, it is possible to prevent chips generated at the time of fastening with the screw from scattering into the CDU 100. In the case of a metal screw, high strength can be obtained as compared with a resin screw.

The cover 27 is electrically insulating, and is a flat plate spreading in the up-down direction Z2 and the left-right direction Y2 in the rear direction X12 with respect to the display 22 and the circuit board 24 in the electronic device 2 (see FIG. 5). In the example embodiment, the cover 27 is attached to the spacer 23 via four screw spacers 271. Only two screw spacers 271 are illustrated in FIGS. 4 and 5.

The description will be made referring again to FIGS. 2 and 3. As illustrated in FIG. 2, the CDU 100 further includes a panel support portion 7. The panel support portion 7 is, for example, one hinge, and supports the supports panel 21 in the electronic device 2 so as to be movable between a closed position P01 (see FIG. 2) where the opening 15 is closed and an open position P02 (see FIG. 3) where the opening 15 is opened. Specifically, the panel support portion 7 rotatably supports the panel 21 in a circumferential direction θ01 of an axis A06 extending in the up-down direction 22 along the inner edge 16 of the opening 15 between the closed position P01 and the open position P02.

The panel support portion 7 makes it possible to provide the CDU 100 with good usability. Specifically, when the panel 21 is at the closed position P01, the screw portions of the thumbscrews 211A and 211B are screwed into the screw holes 17A and 17B, respectively. As a result, the electronic device 2 is fastened to the chassis 1. This prevents entry of foreign matter from the outside to the inside of the chassis 1. The user loosens the thumbscrews 211A and 211B by manual operation, and then moves the panel 21 from the closed position P01 to the open position P02. That is, the CDU 100 can mutually change the state between the closed state and the open state. As a result, the user can access the inside of the chassis 1. That is, the user can check and maintain the components (the circuit board 3 and the like) in the chassis 1. Since the electronic device 2 is subjected to electrostatic countermeasures, the influence of static electricity on the display 22 is suppressed when the user opens and closes the panel 21 by manual operation.

The electrically insulating cover 27 covers the display 22 at a position farther from the display 22 in the rear direction X12 than the opening 28. Therefore, when the panel 21 is opened and closed, the user directly contacts the cover 27 to suppress the influence of static electricity on the display 22 and the circuit board 24. Since the cover 27 prevents the user from directly contacting the circuit board 24, damage to the circuit board 24 is suppressed.

The drawings schematically mainly show each constituent element in order to facilitate understanding of the present disclosure, and the thickness, length, number, interval, and the like of each constituent element that are shown may be different from the actual ones for convenience of the drawings. The configuration of each constituent element illustrated in the above example embodiment is an example and is not particularly limited, and it goes without saying that various modifications can be made without substantially departing from the effects of the present disclosure.

In the example embodiment, the board support portion 25 is provided on the display 22. However, the present disclosure is not limited thereto, and the board support portion 25 may be provided on the panel 21 or the spacer 23.

In the example embodiment, the spacer 23 is interposed between the entire region of the inner edge 212 of the panel 21 and the entire region of the outer periphery 223 of the display region 222. However, the present disclosure is not limited thereto, and the spacer 23 may be interposed between a part of the inner edge 212 and a part of the outer periphery 223.

In the example embodiment, the spacer 23 is divided into four. However, the present disclosure is not limited thereto, and the spacer 23 may not be divided, or may be divided by a number other than 4.

In the example embodiment, the spacer 23 is fixed to the panel 21 by the screw. However, the present disclosure is not limited thereto, and the spacer 23 may be fixed to the panel 21 by an adhesive as another example of the fixing portion.

In the example embodiment, the panel support portion 7 rotatably supports the panel 21 between the closed position P01 (see FIG. 2) and the open position P02 (see FIG. 3). However, the present disclosure is not limited thereto, and the panel support portion 7 may support the panel 21 slidably in the left-right direction Y1.

The CDU 100 may further include a touch screen (touch sensor). The touch screen covers the display region 222 on the front direction X21 side, and detects a position on the display region 222 operated by the user. The touch screen constitutes a touch panel together with the display 22. With the touch panel, the CDU 100 can provide a so-called graphical user interface (GUI). Therefore, the usability of the CDU 100 is improved. On the other hand, the touch panel increases the opportunity for the user to contact the electronic device 2. However, even if contact opportunities increase, the spacer 23 suppresses an influence of static electricity on the display 22.

The technologies according to example embodiments of the present disclosure can also adopt any of the following configurations.

(1) An electronic device including a conductive panel including a first opening, a display to display an image, and an electrically insulating spacer that is fixed to the panel, in which the spacer supports the display at a position away from the first opening in an intersecting direction intersecting with the first opening, and electrically isolates the display from the panel.

(2) The electronic device according to (1), in which the spacer is in direct contact with each of the panel and the display.

(3) The electronic device according to (1) or (2), further including a circuit board and a board support portion that supports the circuit board at a position farther from the first opening in the intersecting direction than the display, the board support portion being provided on the display, in which the circuit board is electrically isolated from the panel.

(4) The electronic device according to any one of (1) to (3), in which the display has a polygonal shape in plan view from the intersecting direction, and the spacer is in contact with each of two opposite sides of the polygonal shape to support the display.

(5) The electronic device according to any one of (1) to (4), in which the display includes a display region, and the spacer is interposed between an entire inner edge of the panel opposing the first opening and an entire outer periphery of the display region.

(6) The electronic device according to any one of (1) to (5), in which the spacer includes four divided spacers interposed between the entire inner edge and the entire outer periphery.

(7) The electronic device according to any one of (1) to (6), further including a conductive fixing portion that fixes the spacer to the panel, the fixing portion not penetrating the spacer from a first side to a second side in the intersecting direction.

(8) The electronic device according to any one of (1) to (7), further including an electrically insulating fixing portion that fixes the spacer to the panel.

(9) The electronic device according to any one of (1) to (8), in which the spacer sandwiches and supports the display from both sides in the intersecting direction.

(10) A refrigerant circulation device including the electronic device according to any one of (1) to (9), a chassis including a flow path for a refrigerant, and a pump assembly to pressure-feed the refrigerant in the flow path.

(11) The refrigerant circulation device according to (10), in which the chassis further includes a second opening, and a panel support portion that movably supports the panel between a closed position where the panel closes the second opening and an open position where the panel opens the second opening.

(12) The refrigerant circulation device according to (10) or (11), in which the panel support portion rotatably supports the panel about an axis along the second opening between the closed position and the open position.

(13) The refrigerant circulation device according to any one of (10) to (12), in which the electronic device further includes a cover that covers the display at a position farther from the first opening in the intersecting direction than the display.

The technologies according to example embodiments of the present disclosure are suitable for electronic devices and refrigerant circulation devices, and have industrial applicability.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A refrigerant circulation device comprising:
an electronic device including:
a conductive panel including a first opening;
a display to display an image; and
an electrically insulating spacer that is fixed to the panel;
a chassis including a flow path of a refrigerant; and
a pump assembly to pressure-feed the refrigerant in the flow path; wherein
the spacer supports the display at a position away from the first opening in an intersecting direction intersecting with the first opening, and electrically isolates the display from the panel; and
the chassis further includes:
a second opening; and
a panel support portion that movably supports the panel between a closed position where the panel closes the second opening and an open position where the panel opens the second opening.

2. The refrigerant circulation device according to claim 1, wherein the spacer is in direct contact with each of the panel and the display.

3. The refrigerant circulation device according to claim 1, further comprising:
a circuit board; and
a board support portion that supports the circuit board at a position farther from the first opening in the intersecting direction than the display, the board support portion being provided on the display; wherein
the circuit board is electrically isolated from the panel.

4. The refrigerant circulation device according to claim 1, wherein
the display has a polygonal shape in plan view from the intersecting direction; and the spacer is in contact with each of two opposite sides of the polygonal shape to support the display.

5. The refrigerant circulation device according to claim 1, wherein the display includes a display region; and the spacer is interposed between an entire inner edge of the panel opposing the first opening and an entire outer periphery of the display region.

6. The refrigerant circulation device according to claim 5, wherein the spacer includes four divided spacers interposed between the entire inner edge and the entire outer periphery.

7. The refrigerant circulation device according to claim 1, further comprising a conductive fixing portion that fixes the spacer to the panel, the conductive fixing portion not penetrating the spacer from a first side to a second side in the intersecting direction.

8. The refrigerant circulation device according to claim 1, further comprising an electrically insulating fixing portion that fixes the spacer to the panel.

9. The refrigerant circulation device according to claim 1, wherein the spacer sandwiches and supports the display from two sides in the intersecting direction.

10. The refrigerant circulation device according to claim 1, wherein the panel support portion rotatably supports the panel about an axis along the second opening between the closed position and the open position.

11. The refrigerant circulation device according to claim 1, wherein the electronic device further includes a cover that covers the display at a position farther from the first opening in the intersecting direction than the display.

* * * * *